US008791700B2

(12) United States Patent
Witschey et al.

(10) Patent No.: US 8,791,700 B2
(45) Date of Patent: Jul. 29, 2014

(54) METHOD OF MR (=MAGNETIC RESONANCE) WITH SPATIAL ENCODING TO GENERATE AN IMAGE OR SPECTROSCOPIC DATA

(75) Inventors: Walter Witschey, Philadelphia, PA (US); Daniel Gallichan, Freiburg (DE); Maxim Zaitsev, Freiburg (DE); Gerrit Schultz, Freiburg (DE); Juergen Hennig, Freiburg (DE)

(73) Assignee: Universitaetsklinikum Freiburg, Freiburg (DE)

( * ) Notice: Subject to any disclaimer, the term of this patent is extended or adjusted under 35 U.S.C. 154(b) by 357 days.

(21) Appl. No.: 13/137,086

(22) Filed: Jul. 20, 2011

(65) Prior Publication Data
US 2012/0025822 A1 Feb. 2, 2012

(30) Foreign Application Priority Data
Jul. 23, 2010 (EP) .................................. 10 170 643

(51) Int. Cl.
*G01V 3/00* (2006.01)
*G01R 33/44* (2006.01)
(52) U.S. Cl.
CPC .................................. *G01R 33/445* (2013.01)
USPC ........................................ 324/309; 324/307
(58) Field of Classification Search
CPC .................................................... G01R 33/445
USPC .................. 324/309, 307, 306, 312
See application file for complete search history.

(56) References Cited

U.S. PATENT DOCUMENTS

| 4,385,277 | A |   | 5/1983 | Hanley |
| 4,642,567 | A | * | 2/1987 | Kaplan .......................... 324/309 |
| 4,651,098 | A | * | 3/1987 | Yamada et al. ............... 324/309 |

(Continued)

OTHER PUBLICATIONS

Meyerand, M.E. et al., "Time Encoded Magnetic Resonance Imaging: A Novel Single-Shot Technique", Proc. of the ISMRM, 1993, p. 472.

(Continued)

*Primary Examiner* — Louis Arana
(74) *Attorney, Agent, or Firm* — Paul Vincent

(57) ABSTRACT

A method of MR with spatial encoding to generate an image or spectroscopic data of an object of investigation inside an MR apparatus comprises the steps of (a) selecting a volume of interest within the object of investigation, (b) applying an RF pulse to generate a transverse magnetization within the object of investigation, (c) preparing a nonlinear phase distribution within the object of investigation by application of spatially encoding magnetic fields (SEMs), the SEMs comprising of a nonlinear gradient field or a combination of linear and nonlinear gradient fields, (d) effecting primary spatial encoding through application of SEMs, and (e) recording MR signals originating from the object of investigation. Step (c) or (d) thereby comprises applying a sequence of at least two SEMs, at least one of which contains a nonlinear field gradient and at least two of the SEMs having different field geometries. The sequence of SEMs is applied at a point in time from and including the excitation of the object of interest in step (b) up to and including the recording of the MR signals in step (e), to thereby introduce a temporal shift of the signals arising from spatially different locations within the selected volume of interest, that is to thereby introduce a shift of local spatial frequency components. A sampling window for recording of the respective MR signals is set and signals originating from the volume of interest are recorded in step (e) and undesired signals originating from outside the volume of interest are suppressed.

15 Claims, 12 Drawing Sheets

(56) References Cited

U.S. PATENT DOCUMENTS

| | | | | |
|---|---|---|---|---|
| 5,122,748 | A * | 6/1992 | Oh et al. | 324/309 |
| 7,208,949 | B2 * | 4/2007 | Fuderer | 324/309 |
| 2007/0090838 | A1 * | 4/2007 | Hennig | 324/307 |
| 2012/0286783 | A1 * | 11/2012 | Constable et al. | 324/309 |

OTHER PUBLICATIONS

Satoshi Ito et al., "Alias-Free Image Reconstruction Using Fresnel Transform in the Phase-Scrambling Fourier Imaging Technique", Magnetic Resonance in Medicine 60:422-430 (2008).

Yoav Shrot, et al., "Spatially encoded NMR and the Acquisition of 2D magnetic resonance images within a single scan", Journal of Magnetic Resonance 172 (2005) 179-190.

James G. Pipe, "Spatial Encoding and Reconstruction in MRI with Quadratic Phase Profiles", MRM 33:24-33 (1995).

Yoshifumi Yamada, "NMR Fresnel transform imaging technique using a quadratic nonlinear field gradient", Rev. Sci. Instrum. 63(11), Nov. 1992.

S. Ito et al., "Parallel Image Reconstruction using a Single Signal and PSFT Anti-alias Image Reconstruction", Proc. Intl. Soc. Mag. Reson. Med. 16 (2008).

David G. Wiesler et al., Improved Field of View-Reducing Gradient Insert: Artifacts and Application to Cardiac Imaging, Journal of Magnetic Resonance Imaging 10:209-216 (1999).

R.E. Gordon et al., "Localization of metabolites in animals using $^{31}$P topical magnetic resonance", Nature, vol. 287, Oct. 23, 1980.

* cited by examiner

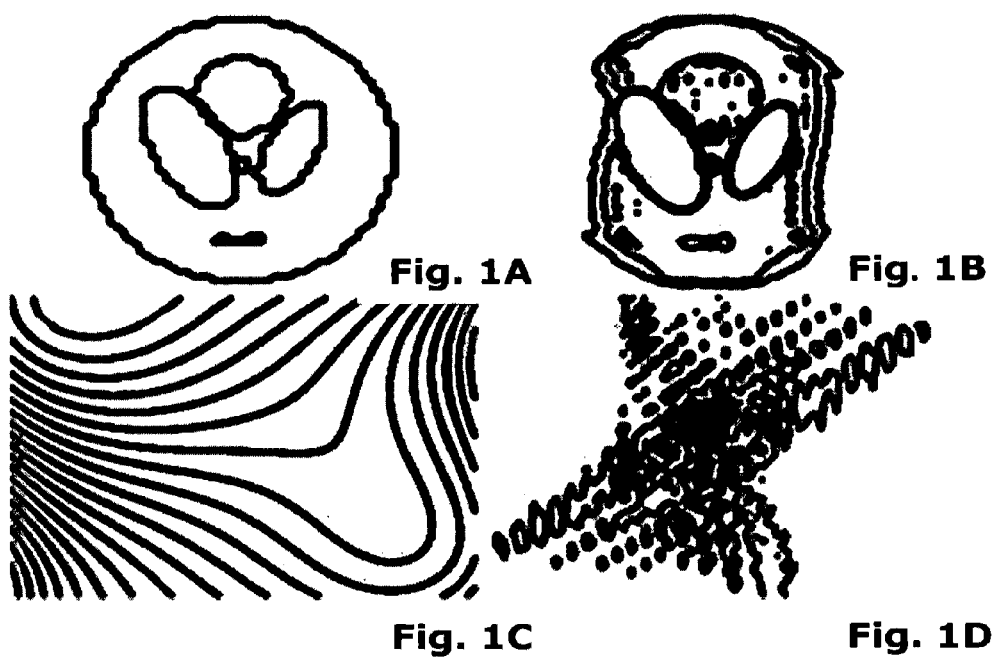

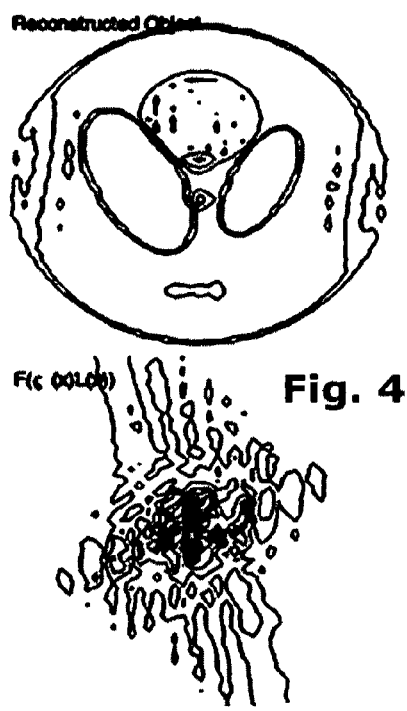 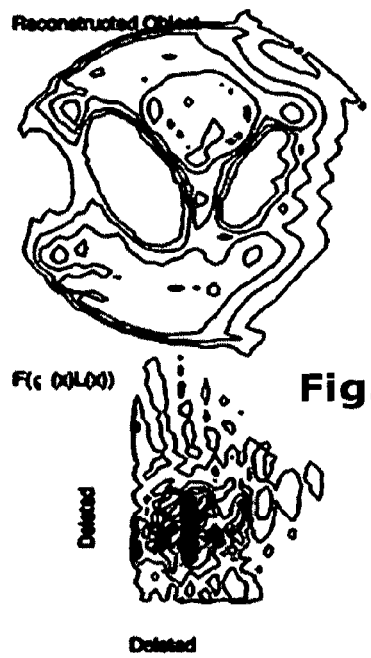
Fig. 4A　　Fig. 4B
Fig. 4C　　Fig. 4D

METHOD OF MR (=MAGNETIC RESONANCE) WITH SPATIAL ENCODING TO GENERATE AN IMAGE OR SPECTROSCOPIC DATA

This application claims Paris convention priority of EP 10 170 643.0 filed Jul. 23, 2010, the entire disclosure of which is hereby incorporated by reference

BACKGROUND OF THE INVENTION

This invention relates to a method of magnetic resonance (=MR) with spatial encoding to generate an image or spectroscopic data of an object of investigation inside an MR apparatus comprising the steps of:
(a) selecting a volume of interest within the object of investigation;
(b) applying an RF pulse to generate a transverse magnetization within the object of investigation;
(c) preparing a nonlinear phase distribution within the object of investigation by application of spatially encoding magnetic fields (SEMs), the SEMs comprising a nonlinear gradient field or a combination of linear and nonlinear gradient fields;
(d) effecting primary spatial encoding through application of SEMs; and
(e) recording MR signals originating from the object of investigation.

In MR (magnetic resonance) methods, nuclear spins can be polarized by means of a strong static magnetic field and then excited and manipulated using radiofrequency (RF) pulses and controlled magnetic fields. Generally, RF pulses are delivered by means of external and transverse oscillating magnetic fields delivered in the neighborhood of the Larmor frequency of the spin.

The primary method to obtain signals from a volume of interest within an object of investigation, e.g. in magnetic resonance imaging (MRI), is by localization. There are many different methods of localization, each having particular advantages and disadvantages.

Phase scrambling can be used to localize signals by causing suppression of signals in a strong magnetic field gradient [ref. 7-12] or by performing a limited reconstruction or Fresnel reconstruction [ref. 14-15].

Also, radiofrequency (RF) coils may be used to detect signals from local regions. In this method, only spins which are in close proximity to the RF coil are detected. Other spins lying farther away from the RF coil induce less current in the RF coil and, consequently, the detectable signal from regions far from the coil is negligible.

Topical magnetic resonance is another method of signal localization [ref. 1-12], where external magnetic fields are applied to localize the signal to the homogeneous isocenter of the magnet or to the far field of an externally applied, but surface-lying gradient. These methods make use of line broadening or intravoxel dephasing techniques, such that the total signal within a detectable region is cancelled by virtue of a broad line width or uniform dispersion of spin phase over the region, respectively. This situation occurs especially in the proximal region of a strong magnetic field gradient. Localization is achieved by isolating spins which have a coherent phase and, therefore, a net detectable signal.

In previous inventions [ref. 2, 3], magnetic field gradients of 2nd order and higher are used to isolate regions of homogeneity. Gradients of 2nd order and 4th order are used to vary the size of the region of homogeneity, although one skilled in the art would recognize that combinations of high order gradient fields would give varying geometries. There is no mechanism specified for further localization of signal beyond a single lumped region or how one could move such a region or reshape it in a well-defined way. Instead, the sample itself is moved within the static field, which, unfortunately, is unsuitable for current magnetic resonance imaging techniques, which have demands on patient positioning and comfort, as well as the ease of operator use.

Other disadvantages of these techniques is that they are isolated to the homogeneous center of the magnet, broaden magnetic resonance signals unnecessarily, are poorly defined in shape, or not used as an anti-aliasing method to increase scan resolution or further localization of signal in more than one dimension (topical magnetic resonance). Apart from that, it is also difficult to manipulate or construct radiofrequency RF coils in such a way as to make a definite volume.

Slice selection uses radiofrequency pulses in combination with magnetic field gradients that may be applied to excite bands of signals that fall within the spectral response of the applied radiofrequency pulse. This method, in combination with the first, is used the most often in practice. One such method of localization in 3 dimensions uses a series of three pulses, one excitation pulse and two refocusing pulses, in conjunction with magnetic field gradients, to localize a small voxel of signal.

In more complicated and less common techniques, arrays of radiofrequency coils, with independently controllable phase and frequency, in conjunction with time-varying magnetic field gradients are used to localize signals from regions having complex shapes, such as single organs of a human body.

Some disadvantages, unique to the RF coil approach, are a) the non-uniformities of the radiofrequency field across the volume and b) the relatively long time necessary to apply the sequence of RF pulses and gradients that will localize the signal, during which the detectable signal can be lost and not recovered and the fact that c) shaped pulses used for localization may deposit too much electromagnetic radiation in human subjects.

In particular, as the Larmor frequency increases with the construction of ultra high static magnetic fields, (a) and (c) increasingly limit the durations, shapes and amplitudes of radiofrequency pulses.

SUMMARY OF THE INVENTION

The present invention is directed toward an improved MR method and apparatus which overcomes the limitations of other methods of localization set forth above.

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In the MR method according to the invention the preparing a nonlinear phase distribution step (c) or the effecting a primary spatial encoding step (d) includes applying a sequence of at least two SEMs, at least one of which contains a nonlinear field gradient and at least two of which having different field geometries, wherein the sequence of SEMs is being applied at a point in time from and including the excitation of the object of interest in step (b) up to and including the recording of the MR signals in step (e), to thereby introduce a temporal shift of the signals arising from spatially different locations within the selected volume of interest, that is to thereby introduce a shift of local spatial frequency components, and wherein a sampling window for recording of the respective MR signals is set, such that signals originating from the volume of interest are recorded in step (e) and undesired signals originating from outside the volume of interest are suppressed.

In this invention an appropriate spatial frequency filter is designed to eliminate signals from outside the volume of interest or modulate signals within using the local spatial frequency concept. The method according to the invention allows for an arbitrary localization of MR signals by modulation of the local spatial frequencies. In preparing the nonlinear phase distribution, the additional linear magnetic field in combination with the nonlinear gradient field is used to impart a controllable shift of the object location-spatial frequency correspondence between locations in the object and respective local spatial frequencies in the spatial frequency domain.

The present invention allows for shifting or translating the region over which the volume of interest is localized, whereas TMR or phase-scrambled anti-aliased reconstructions are strictly limited to either the homogeneous isocenter of the static magnetic field of the MR apparatus or the far field of a surface lying coil. Unlike topical magnetic resonance techniques, the present invention necessarily involves magnetic field encoding together with a phase preparation function. The extent of localization is determined by a combination of the voxel size and the amplitude of magnetic field moments of the spatially encoding magnetic fields used.

The slice selection techniques use shaped RF pulses in combination with linear magnetic field gradients to localize signals within the bandwidth of the RF pulse, thus requiring substantially longer echo times to generate an accurate localization of signals.

Compared to most other phase scrambling techniques, the phase preparation function is sufficiently strong to locally eliminate signals through the spatial encoding. The phase preparation function can be further used for suppression/ elimination of undesired spatial frequency components in a further signal processing steps following recording of the MR signals.

In a preferred embodiment of the invention the nonlinear gradient field used in the preparing a nonlinear phase distribution step (c) is a quadratic magnetic field resulting in a linear correspondence between locations within the object of investigation and respective local spatial frequencies in the spatial frequency domain.

In yet another embodiment of the invention the preparing the nonlinear phase distribution step (c) and/or the effecting a primary spatial encoding step (d) is/are performed in either two or three dimensions. A three-dimensional approach facilitates MR sequences with improved signal-to-noise ratios, even though the design of a specific three-dimensional magnetic field is by far more complex.

In yet another embodiment of the invention the magnetic field used in step (c) and/or (d) is spatially variable and constant or variable in time, and the magnetic field is in particular being simultaneously applied during transmission of a radiofrequency (RF) pulse. This allows for a flexible preparation of the phase preparation and/or spatial encoding as well as a rapid signal acquisition.

The RF pulse used for generating a transverse magnetization within the object of investigation is preferably caused by application of constant or pulsed currents to at least one RF coil or an array of RF coils.

In yet a further preferred embodiment of the invention, the nonlinear field is produced by a shim coil of first, second or higher order, thereby making use of an already existing feature of MR apparatuses used in practice.

In yet another embodiment of the invention, a technique is used to reduce spatial frequency aliasing artifacts from locations within the object of interest, the technique involving a multicoil reconstruction technique, in particular, SENSE, GRAPPA or the like. Hereby, aliasing artifacts from inconsistent or misplaced encoded signals can be eliminated by virtue of coil sensitivities.

In yet another embodiment of the invention conventional imaging sequences, in particular, gradient echo, spin echo, fast low angle shot (FLASH), fast spin echo (FSE), echo planar imaging (EPI), and/or nuclear imaging (CSI), are used for generating an MR image or spectroscopic data.

In yet another embodiment of the invention Cartesian, radial, or spiral encoding strategies are used for filling of the spatial frequency domain.

According to another embodiment of the invention, acceleration techniques are used, the acceleration techniques making use of spatial frequency domain, in particular k-space (GRAPPA) or image space (SENSE) reconstructions. Thereby, acquisition of MRI or spectroscopic data can be further accelerated.

In yet another embodiment of the invention the (desired) spatial frequencies are acquired multiple times to enhance the MR signals in a spatially dependent way.

In yet a further embodiment of the invention the MR echoes (signals) are reordered in single- or multishot acquisitions. This can for example be performed by making use of the object location-spatial frequency correspondence to define a reordered sequence, where for example frequency components belonging to regions, which are strongly effected by long echo times, are acquired first.

In the accompanied drawings, which are incorporated in and constitute a part of this specification, embodiments of the invention are illustrated, which together with a general description given above, and the detailed description given below, serve to exemplify the essential principles of the invention. It will be appreciated, that those skilled in the art will be able to devise various arrangements that, although not explicitly described or shown herein, embody the principles of the invention and are included within its scope. Furthermore, all examples are to be construed as being without limitation to such specifically recited examples and conditions. Moreover, all statements herein reciting principles, aspects, and embodiments of the invention, as well as specific examples thereof, are intended to encompass equivalents thereof.

BRIEF DESCRIPTION OF THE DRAWING

FIGS. 1A-D illustrate the relationship between the object (FIG. 1A), its reconstructed image (FIG. 1B), the phase preparation applied (FIG. 1C) and its Fourier domain signals (FIG. 1D);

FIGS. 4A-D depict a method to isolate signals by phase preparation and Fourier domain selection. In this technique, the object (FIG. 4A) is related to its reconstructed image (FIG. 4B) by the distribution of signals in the Fourier domain (FIG. 4C) determined by the phase preparation. The reconstructed object is determined by Fourier domain selection (FIG. 4D), where one can choose the regions of signal to suppress from their Fourier representation;

In FIG. 8A, the nonlinear magnetic field is switched on following nonselective excitation, prior to frequency encoding and possibly overlapping with any phase encoding magnetic fields. In FIG. 8B, the nonlinear magnetic field is switched on following nonselective excitation, but prior to frequency encoding in three dimensions;

DESCRIPTION OF THE PREFERRED EMBODIMENT

Figure 2A:
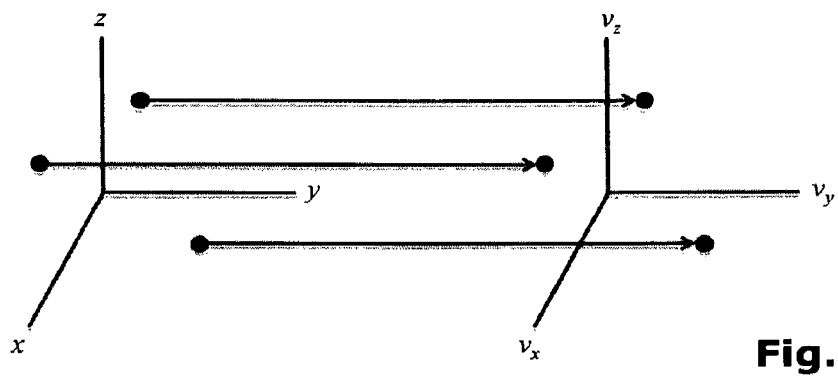
FIGS. 2A-B show a diagram depicting the object location-spatial frequency correspondence. For the case of quadratic fields (FIG. 2A), this is a 1:1 correspondence. For phase preparations of arbitrary shape, there is some other correspondence that maps object locations to their Fourier domain representations (FIG. 2B)

Selecting a Volume of Interest within the Object of Investigation (Step a)

There are various ways to select volume of interests from within an object of investigation that are well known in the field of MR. The volume of interest may be selected with prior knowledge of the object's position, which may obtained from prior or 'scout' images. These scout images are typically very short duration, low resolution images obtained to determine the object's specific placement and orientation within the MRI apparatus. Alternatively, a volume of interest can be selected without this prior knowledge, in a fashion identical to the way the initial scout images are acquired.

Preparing a Transverse Magnetitzation with Nonlinear Phase Distribution

The transverse magnetization or signal in a MRI experiment is created by applying RF energy to the object in the neighborhood of the spin Larmor frequency. The equation for the transverse magnetization is given by $$S(t) = \int_{-\infty}^{\infty} \rho(\vec{x}) e^{i\phi(\vec{x},t)} d\vec{x}$$

where $\rho(\vec{x})$ is a spin density function, which describes the distribution of magnetization resonating in the vicinity of the Larmor frequency $\omega_0$ of the imaging experiment and $\phi(\vec{x},t)$ is the phase function, a time and spatially varying phase that is imparted on the object. $\rho(\vec{x})$ is a real function and can be expanded as a multidimensional Fourier series, whose coefficients are called spatial frequencies. It is possible to expand the phase function to second order $$\phi(\vec{x}, t) = \phi(\vec{x}_0, t) + \nabla \phi(\vec{x}_0, t) \cdot (\vec{x} - \vec{x}_0) + \frac{1}{2}(\vec{x} - \vec{x}_0) \cdot H(\vec{x}_0, t) \cdot (\vec{x} - \vec{x}_0)$$

and introducing the Hessian $$H_{ij}(\vec{x}_0, t) = \frac{\partial^2 \phi(\vec{x}_0, t)}{\partial x_i \partial x_j}$$

we define the wave vector $$\vec{k}(\vec{x} - \vec{x}_0, t) \doteq \nabla \phi(\vec{x}_0, t) + \frac{1}{2}(\vec{x} - \vec{x}_0) H(\vec{x}_0, t)$$

To proceed further, the phase function must be defined explicitly. Step (b) applies generally to any transverse magnetization with a nonlinear phase distribution prepared within the object of interest.

It's possible to decompose the phase functions into two parts, the
(1) phase preparation function L(x,t) and
(2) the encoding function E(x,t)

$$S(t) = e^{i\phi(\vec{x}_0, t)} \int_{-\infty}^{\infty} \rho(\vec{x}) L(x, t) E(x, t) d\vec{x}$$

The phase preparation function and encoding function serve distinct purposes. The phase preparation is used to generate the object location-spatial frequency correspondence. This correspondence is a general mapping of object locations to spatial frequencies in the Fourier domain. For the special case of a quadratic phase preparation, this corresponds to a simple 1:1 mapping, where object locations are shifted proportional to the magnetic field moments qi.

The encoding function serves to encode the object in the spatial frequency domain. As is usually the case in MRI, the encoding function L(x,t) superimposes complex spatially-varying spatial frequencies, conventionally using linear magnetic field gradients. Spatial encoding determines which spatial frequencies are acquired from the object.

Preparing a Transverse Magnetization with a Quadratic Phase Distribution

A particular geometry composed of linear and quadratic magnetic fields corresponds to the conventional situation in magnetic resonance imaging with constant applied quadratic magnetic fields. This is just one example of a nonlinear phase distribution prepared within the object of investigation. In this embodiment, time varying linear magnetic fields are applied and impart phase shifts across the object (encoding) and quadratic magnetic fields add an additional spatially varying phase shift. Defining the encoding function $$\phi(x,t) = [q_1(t) \; q_2(t) \; q_3(t) \; q_4(t) \; q_5(t)] \begin{bmatrix} 1 \\ x \\ y \\ x^2 - y^2 \\ 2xy \end{bmatrix}$$

where each element q represents a time integral of the magnetic field amplitude over time $$q_i(t) = \gamma \int_0^t G_i \, d\tau$$

The encoding functions can be written to second order as $$\phi(\vec{x},t) = \phi(\vec{x}_0,t) + \begin{bmatrix} q_2 + 2q_4 y_0 + 2q_5 x_0 \\ q_3 + 2q_5 x_0 - 2q_4 y_0 \end{bmatrix}^T \begin{bmatrix} x - x_0 \\ y - y_0 \end{bmatrix} +$$

$$\begin{bmatrix} x - x_0 \\ y - y_0 \end{bmatrix}^T \begin{bmatrix} q_5 & q_4 \\ q_4 & -q_5 \end{bmatrix} \begin{bmatrix} x - x_0 \\ y - y_0 \end{bmatrix}$$

This result is exact to second order. Rewriting the signal equation $$S(t) = e^{i\phi(\vec{x}_0,t)} \int_{-\infty}^{\infty} \rho(\vec{x}) e^{i\vec{k}(\vec{x}-\vec{x}_0,t)\cdot(\vec{x}-\vec{x}_0)} \, d\vec{x}$$

The wave vector $$\vec{k}(\vec{x}-\vec{x}_0,t) = \begin{bmatrix} q_2 + 2q_4 y_0 + 2q_5 x_0 \\ q_3 + 2q_5 x_0 - 2q_4 y_0 \end{bmatrix}^T + \begin{bmatrix} x - x_0 \\ y - y_0 \end{bmatrix}^T \begin{bmatrix} q_5 & q_4 \\ q_4 & -q_5 \end{bmatrix}$$

As illustrated by the wave vector equation $\vec{k}(\vec{x}-\vec{x}_0,t)$, to second order there is a linear relationship between the gradient moments qi and the wave vector position. This relationship causes a 1:1 object location and spatial frequency correspondence. That is, locations within the object have spatial frequencies which are translated linearly with their positions $\vec{x} - \vec{x}_0$. The translation is given by the quadratic moments of the magnetic field q4 and q5.

Preparing a Transverse Magnetization with an Arbitrary Phase Distribution

The object location-spatial frequency correspondence has been shown in the previous section for quadratic phase distributions, but, quite generally, more complicated geometries could map spatial frequencies to arbitrary locations. This concept is illustrated in FIGS. 1A-D. FIG. 1A shows the distribution of magnetization in object space and FIG. 1B the final reconstructed object after phase preparation, magnetic field encoding and reconstruction. The signal from the final reconstructed object has been localized along the left-right direction due to the phase preparation function in FIG. 1C. The phase preparation shown here is an arbitrary function in space, whose flux lines determine local spatial frequency shifts. A map of the acquired signal in FIG. 1D shows some distribution of the signal energy according to the phase preparation function in the Fourier domain.

Figure 2B:
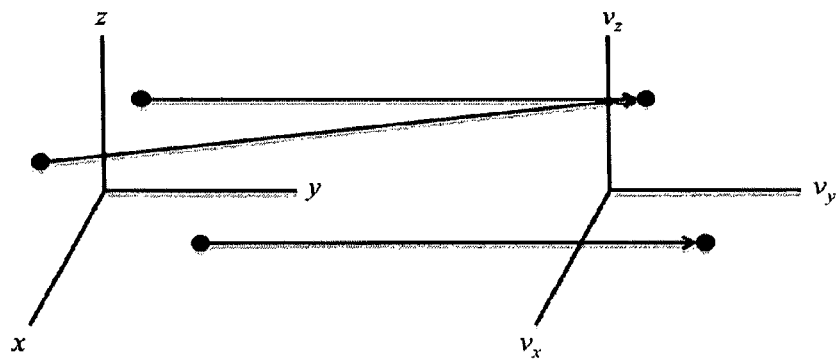

The flexibility with which one chooses the phase preparation function determines the correspondence between object space and the Fourier domain. For the case of a second order phase preparation function, there is a 1:1 correspondence between the object location and its Fourier domain representation. That is to say that object locations have their spatial frequencies shifted linearly with distance. More complicated geometries of the phase preparation function need not specify a 1:1 correspondence, but rather map local spatial frequencies to multiple identical points in the Fourier domain. This concept is illustrated in FIGS. 2A-B. In FIG. 2A, there is a 1:1 correspondence between the object locations and the mapping to locations in the Fourier domain. This kind of 1:1 mapping could be set up through quadratic fields as described earlier. In FIG. 2B, a different sort of mapping is set up, such that two object locations are mapped to the same spatial frequency. For this mapping, a different sort of phase preparation is necessary.

Effecting a Primary Spatial Encoding (Step d)

Spatial encoding is a method to acquire particular spatial frequencies using MRI and is conventionally performed by using linear magnetic field gradients. Spatial frequencies are encoded by acquiring data at spatial frequencies predetermined by the encoding process, also called the encoding or k-space trajectory.

Figure 3:
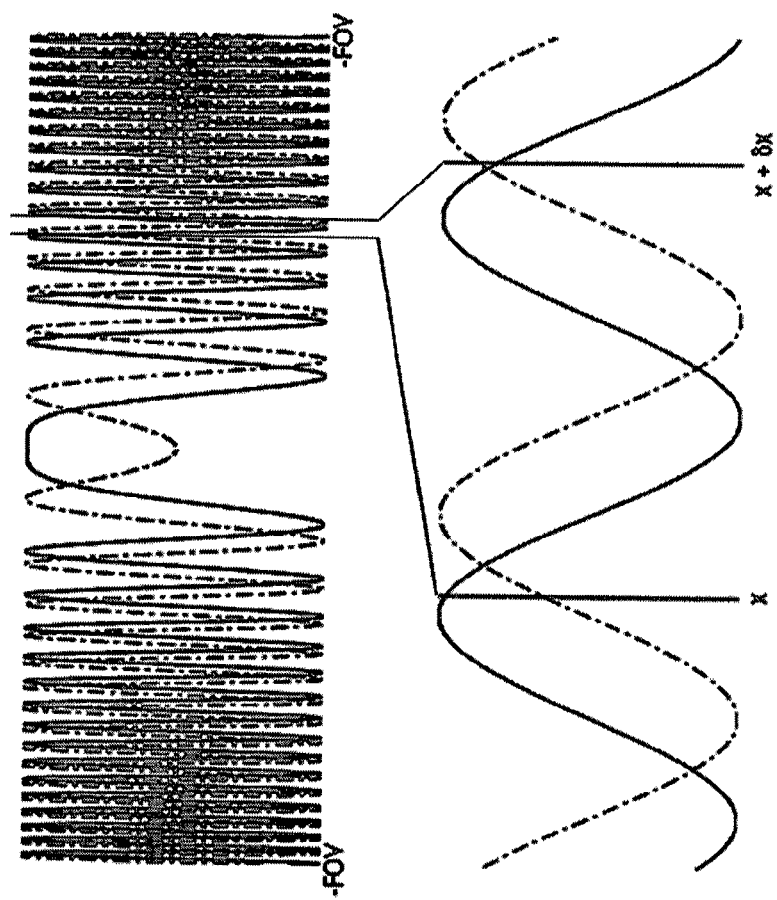
FIG. 3 shows a diagram depicting the one dimensional spatial variation in the phase imparted by a quadratic phase preparation technique. The highlighted region is enhanced to demonstrate that over a small region the frequency is approximately constant. Globally, the frequency increases in a spatially dependent way.

The extent of the region from which signal is obtained is determined by the phase preparation function together with the encoding function, which, in turn, determines the voxel dimensions and signal spread. Consider a one dimensional phase preparation function for the case of a 2nd order spherical field as shown in FIG. 3. The phase preparation function takes the form of a chirp function, whose frequency varies linearly in space. For some infinitesimal shift in position x→x+Δx, the change in the phase is approximately linear with x $$\frac{d\phi(\vec{x},t)}{dx} = 2\gamma \vec{x} \int_0^t q_{4,5}(t')dt'$$

In the Fourier domain, this corresponds to a signal with spatial frequencies whose amplitudes are determined by the convolution $$F(P*\Lambda)(k) = \rho(x)L(x)$$

The Fourier representation is the convolution between the Fourier transform of the object and phase preparation function. This convolution acts to redistribute signal energy in the Fourier domain. Although the phase preparation function here is a one dimensional quadratic field, any function L(x) can redistribute the object spatial frequencies according to the correspondence principle.

The encoding function E(x) constrains the Fourier components sampled during the experiment. Because data is only sampled for a fixed period of time, spatial frequencies greater than $k_{max}$ are not recovered.

For Cartesian encoding, this maximum spatial frequency $$k_{max} = \gamma \int_0^t G_{max}(t')dt'$$

Therefore, combining $$\frac{d\phi}{dx}$$

and $k_{max}$ terms, the position outside of which signal is not recovered is given by $$x_{cutoff} = \frac{\int_0^t q_{2,3}(t')dt'}{\int_0^t q_{4,5}(t')dt'} = \frac{q_{2,3}T_{adc}}{2q_{4,5}T_A}$$

The size of the window is twice this distance $$x_{window} = \frac{\int_0^t q_{2,3}(t')dt'}{\int_0^t q_{4,5}(t')dt'} = \frac{q_{2,3}T_{adc}}{q_{4,5}T_A}$$

The region from which signal is obtained can be shifted to a new location $x_o$, $y_o$ by adjusting the phase preparation function. In the following derivation, we show how the new magnetic field moments may be expressed as combinations of linear and quadratic magnetic fields. The magnetic field moments at the origin are given by $q_i$ and the primed moments, which constrain the region from which signal is obtained, can be found through the equality $$q'_4(x'^2-y'^2)+q'_5(2x'y')+q'_1x'+q'_2y'=q_4[(x-x_0)^2-(y-y_0)^2]+q_52(x-x_0)(y-y_0)+q_2(x-x_0)+q_3(y-y_0)-C$$

Where after some algebra, the primed gradients can be determined by grouping like terms in powers of x and y.

$$q'_4=q_4$$

$$q'_5=q_5$$

$$q'_2=-2q_4x_0-2q_5y_0+q_2$$

$$q'_3=2q_4y_0-2q_5x_0+q_3$$

$$C=q_4(x_0^2-y_0^2)+2q_5x_0y_0-q_2x_0-q_3y_0$$

When the gradients are located precisely at the origin, the linear gradient terms $q_{2,3}=0$.

Rotations are accomplished by rotating the quadratic field some angle θ.

$$q'_4=q_4\cos\theta q_5\sin\theta$$

$$q'_5=q_4\sin\theta q_5\cos\theta$$

Encoding and Modulation of Spatial Frequencies

MRI signals can be localized by acquisition or modulation of spatial frequency signals. In this technique, particular spatial frequencies are not encoded, encoded more than once to locally modulate the signal within the volume of investigation, or acquired in a reordered encoding strategy to manipulate contrast or reduce artifacts.

There are several examples of methods for Fourier domain spatial frequency selection:

Signal energy elimination: A general method to localize signals is to remove the bulk of the signal energy in the Fourier domain. There are several methods to identify the bulk of signal energy, but one simple method is simple selection of the zero frequency components, which usually contain the most signal energy. Other methods may involve a weighted sum of spatial frequency signals, selection of spatial frequencies whose amplitudes are within a range of predetermined threshold values, or selection of spatial frequencies above a specific noise level.

Direct current (DC) Selection: MR(I) spatial frequency amplitudes of most objects of investigation are concentrated around the zero-frequency component of the signal. The DC selection requires amplitude or a phase modulation of the dc signal only. Due to the object location-spatial frequency correspondence, the modulation of the spatial frequency signal affects only the dc component of the signal at that location.

Coil Method: RF coil arrays can provide additional localization information, particularly if the RF coil sensitivities are orthogonal or do not substantially overlap. In one embodiment, Fourier transformation is performed separately on data acquired from each coil. Aliased signals containing typically high spatial information will be suppressed if those signals do not originate from the coils nearest to that location.

FIGS. 4A-D illustrate the concept of DC selection mentioned above. FIG. 4A shows a reconstructed object having only a phase preparation and spatial encoding. The Fourier domain representation of this object and its phase preparation is shown in FIG. 4B. A Fourier domain selection is shown in FIGS. 4C and 4D. The desired object locations are selected from the full Fourier acquisition by selective deletion and zero filling, partial Fourier reconstruction or a conjugate phase reconstruction, among other techniques.

Figure 12:
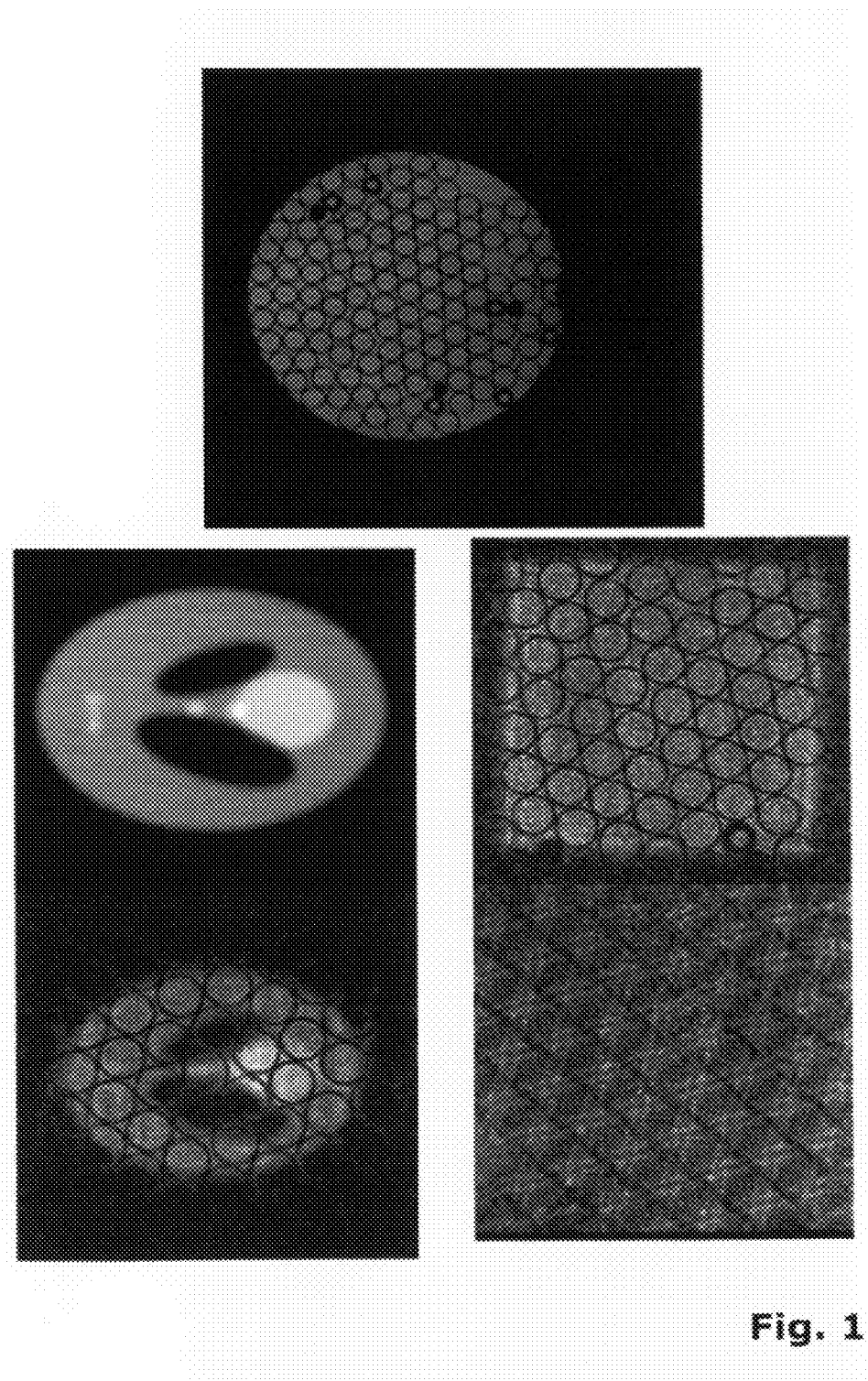
FIG. 12 shows a diagram depicting a phantom acquisition using a modified fast spin echo acquisition to select an arbitrary volume of interest from within the object of investigation. A filter is designed with the desired image space profile with possible amplitude modulation. Spatial frequencies are acquired to take the shape of the desired filter. That is, signals are removed by not acquiring spatial frequencies corresponding with object locations and signals are modulated by acquiring spatial frequency signals more than once.

FIG. 12 shows an example of both spatial frequency selection and amplitude modulation using a predefined filter taking the form of a Shepp-Logan phantom. The image is localized by only acquiring spatial frequencies from signals originating from the volume of interest. Amplitude modulation is performed by reordering the acquisition of the signals using the pulse sequence or by acquiring those signals multiple times. This has the advantage of reducing artifacts and improving signals without appreciably increasing the scan time.

'Bulk' Spatial Frequency Energy

It is useful to understand the relationship between the non-linear phase distribution (step c) and the spatial encoding process (step d). Why do spatial frequencies of the object which are not encoded not contribute substantially to the final image? Why can additional or reordered acquisitions locally modulate the signal within the object?

The phase preparation function creates a spatially varying wave vector $\vec{k}(\vec{x}-\vec{x}_0,t)$ that maps signals from one location to another in the Fourier domain. Fourier domain signals, however, do not have a finite extent, but rather real objects are composed of an infinite number of spatial frequencies. In practice, this means that there is some overlap of signals from multiple locations. The extent of this overlap is determined by the phase preparation function.

Figures 5A, 5B:
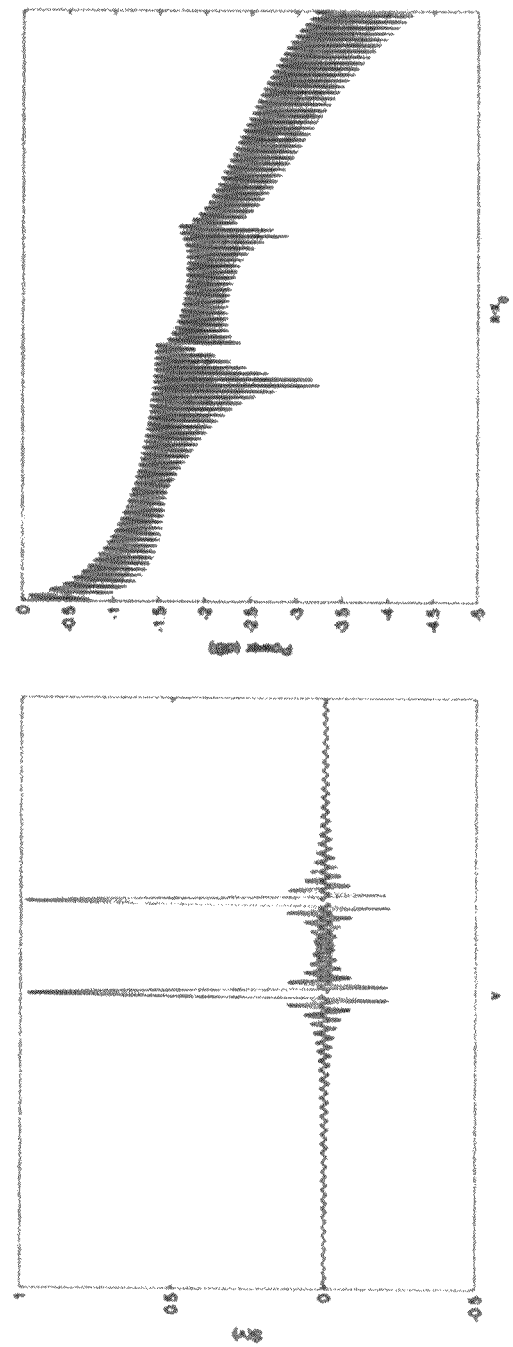
FIGS. 5A-B show a diagram depicting the overlap and signal contamination between two signals in the Fourier domain. These signals, which take the form of sinc functions (A), overlap to some extent, causing misregistration of the object signal after reconstruction. For most biological tissues, the power spectrum (FIG. 5B), computed by from the convolution of the overlap of the two signals, demonstrates that these signals are largely localized.

FIGS. 5A-B show the overlap of two signals in the Fourier domain. The bulk of the signal energy is carried by the center lobe and tapers off.

FIG. 5A shows two signals in the Fourier domain whose shape takes the form of a sinc function:

$$S(k) = S_1(k) + S_2(k) = \frac{\sin((k-k_0)x)}{(k-k_0)x} + \frac{\sin((k-k_1)x)}{(k-k_1)x}$$

There is some overlap between the sinc functions, which results in signal contamination from one location within the object of interest to another. The amount of contamination can be determined by a power spectrum convolution of the two functions:

$$P(x) = \log_{10} \int_{-\infty}^{\infty} S_1(k) S_2(x-k) dk$$

where the power (in dB) of the contamination is determined by the convolution of the two signals.

The power spectrum depicted in FIG. 5B shows that the amount of contamination falls by a factor of 10 a short distance from the central lobe. This rapid decline in the amount of signal contamination limits the amount of artifacts that occur as a result of the nonlinear phase distribution. The greater the dispersion of the object's Fourier domain representation, the greater the contamination and aliasing that may occur.

Object locations with high spatial frequency characteristics may result in significant contamination, however, for most objects encoded, e.g. in medical imaging, the contamination is limited and the signal is effectively localized.

Reduction of High Spatial Frequency Aliasing Artifacts Using Multiple Receiver Coils It was shown in the previous section that the rapid decay in signal power inherently suppresses contamination from other locations. Contamination is small on account of the spread of spatial frequency energy in an object's particular Fourier domain representation. There are, however, instances in which the object has an unusually disperse signal in the Fourier domain. Under these conditions, a reconstructed object may have an undesirable amount of contamination from other locations. There is a solution that may be used to additionally suppress these unwanted signals that uses information from multiple receiver coils.

Figure 6:
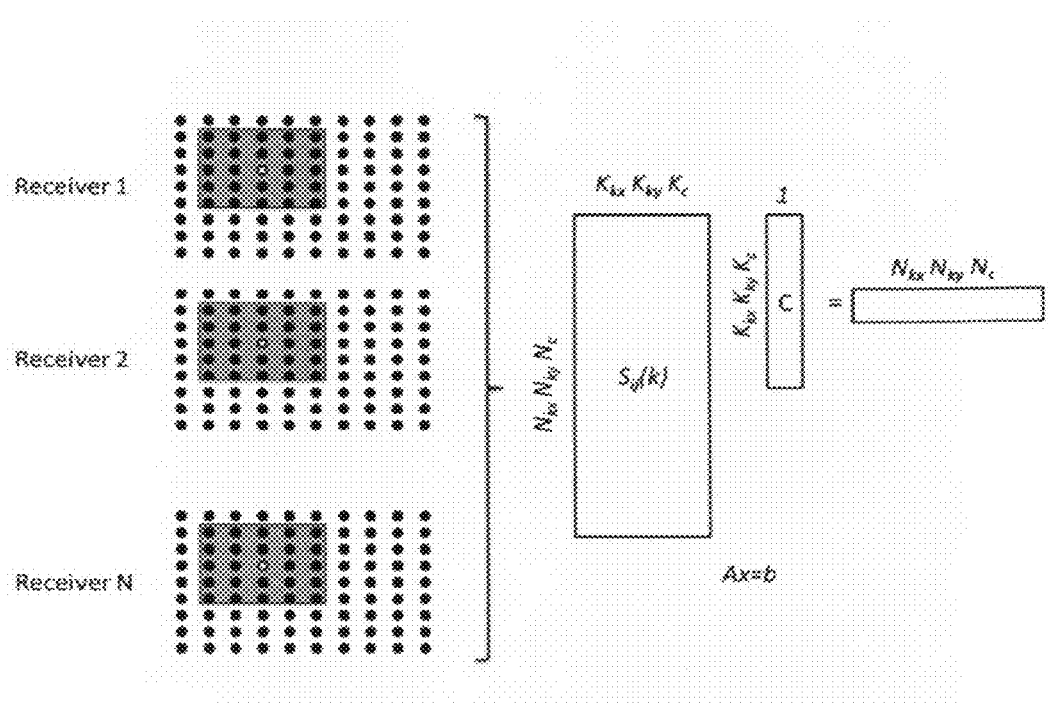
FIG. 6 is a method for eliminating undesirable misregistration or aliasing of signals using a multiple channel receive or parallel imaging technique. In this method, coefficients, which are the amplitudes of linear combinations of signals from different coils, are used to compute the signals in the Fourier domain. All signals are substituted with linear combinations of the old signals with amplitudes determined by coil sensitivities. This method finds signals whose location is inconsistent with measured multiple receive coil information and suppresses them.

In this method, as illustrated in FIG. 6, signals from multiple receiver coils are used to generate a composite reconstruction with the undesirable signals, typically high spatial frequencies, suppressed.

This method is similar to the generalized auto-calibrating partially parallel acquisitions technique (GRAPPA). A multidimensional kernel is selected, which operates over the entirety of acquired signals in the Fourier domain. For the two dimensional case, shown in FIG. 6, a matrix of dimensions Nkx·Nky·Nc X Kkx·Kky·Nc is constructed, where Nkx and Nky are the number of acquired signals in the Fourier domain, Nc the number of receivers used, and Kkx,ky gives the dimensionality of the GRAPPA kernel, the extent of the signals surrounding the central signal to be replaced.

In one method, the coefficients used to reconstruct the k-space signals are given by the least squares solution $$x = A^+ b$$

These coefficients are used to replace all signals in the final matrix with their anti-aliased solutions. In addition, the multiple receiver coils can be used for localization or to improve the signal-to-noise ratio of the image.

Pulse Sequences

There are multiple techniques in which the nonlinear phase preparation function may be generated. Several examples of pulse sequence techniques are presented here.

Phase Preparation with External Magnetic Fields:

The phase preparation function can be generated using external magnetic fields. Either a pulsed magnetic field or a continuous magnetic field can be applied following RF slice-selective or nonselective excitation.

Figure 7:
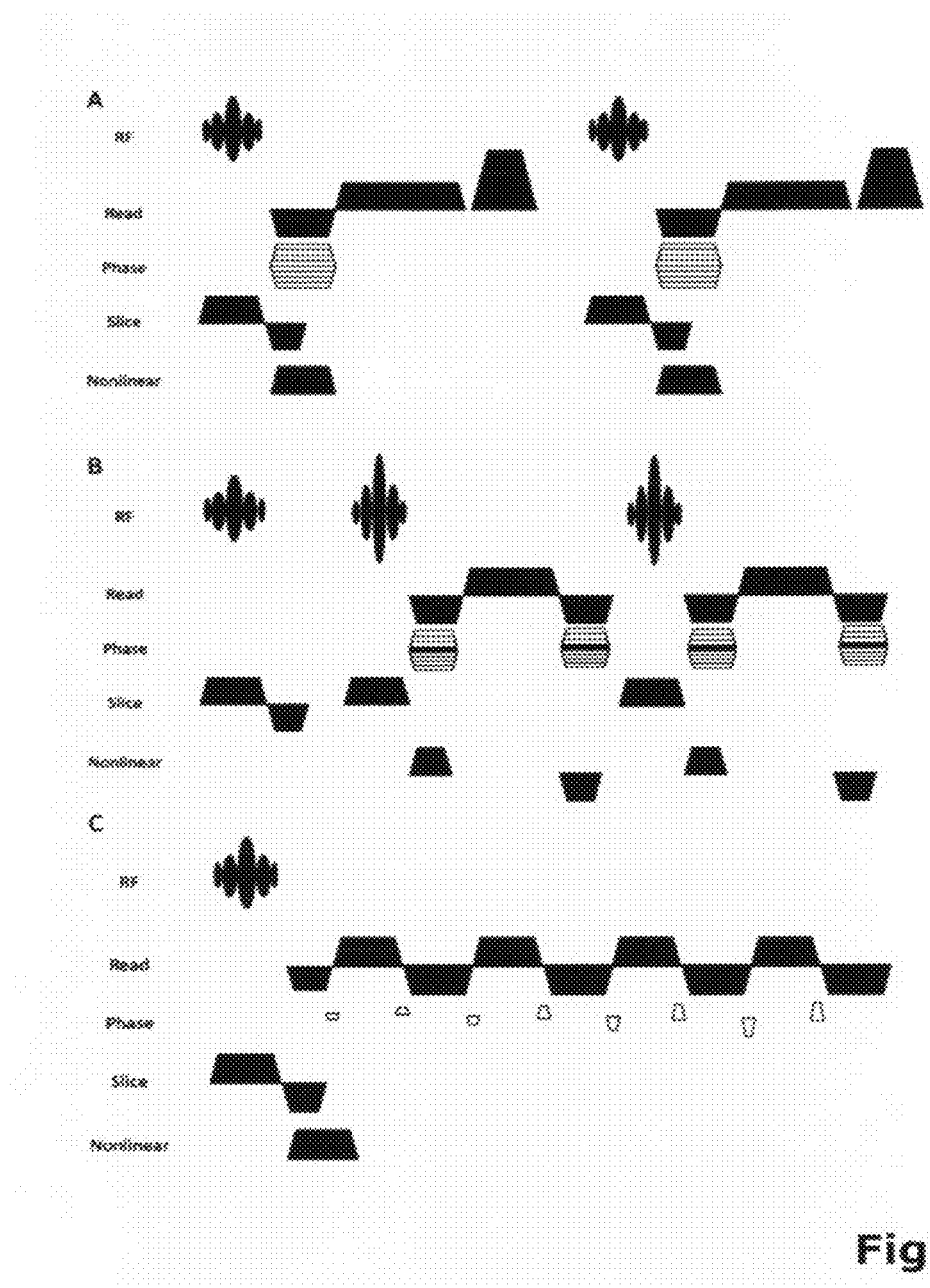
FIG. 7 illustrates three methods for modifications of existing MRI pulse sequences using nonlinear magnetic fields preparation. (A) shows a spoiled gradient echo sequence with nonlinear magnetic field preparation following slice selection and before frequency encoding. (B) shows a fast spin echo (FSE) sequence with nonlinear phase preparation applied following each refocusing pulse to prepare a unique nonlinear phase distribution. (C) shows an echo planar imaging sequence with nonlinear phase preparation prior to the EPI readout gradient echo train.

FIG. 7 shows three example of how conventional pulse sequences may be modified with additional nonlinear magnetic fields:

Modified Conventional Pulse Sequences:

In example A, a conventional gradient echo sequence has been modified to apply a nonlinear magnetic field immediately following RF excitation and prior to data acquisition.

In this strategy, the nonlinear field gradient is applied after every RF pulse and may or may not be refocused using an additional nonlinear field gradient following the data acquisition period. If the nonlinear gradient is not refocused, coherent magnetization pathways may form having undergone multiple periods of dephasing or rephasing from the nonlinear gradient pulse.

In example B of FIG. 7, a conventional fast spin echo (turbo spin echo) acquisition has been modified to include additional nonlinear gradient pulses before and after data acquisition each time the magnetization is refocused to form a spin echo. An alternative strategy may be to prepare the magnetization during the time between the initial excitation pulse and the first refocusing pulse (not shown). When the magnetization is prepared in this way, it is not necessary to pulse the magnetic fields during each formation of the spin echo.

In example C of FIG. 7, a conventional echo planar imaging (EPI) sequence has been modified to include nonlinear magnetic fields immediately prior to the acquisition train. This strategy has the advantage of having a shorter interecho period, especially if the nonlinear magnetic field has a duration longer than the maximum time for phase encoding or ramping of the read gradients before and after data acquisition.

Multidimensional Localization Using Nonselective Excitation and Nonlinear Magnetic Fields In MRI techniques localization is typically performed using slice selection, which uses a combination of shaped RF pulses and linear magnetic field gradients. For some applications, the effective echo times for these conventional localization strategies are too long. In these cases, it may be fortuitous to use only a combination of nonselective excitation and nonlinear magnetic field gradients. This technique has the advantage of having a shorter effective echo time when the time for excitation and localization using the nonlinear gradient fields is sufficiently faster than the total time for localization using shaped RF excitation and linear magnetic fields. In addition, shaped RF pulses are less energy efficient than nonselective RF. In situations where the total energy deposited in tissues by the shaped RF exceeds the maximum regulated amount then nonlinear localization techniques are beneficial. This is particularly relevant at high static magnetic field strengths and in cases where the excitation profile has a nontrivial shape.

Figures 8A, 8B:
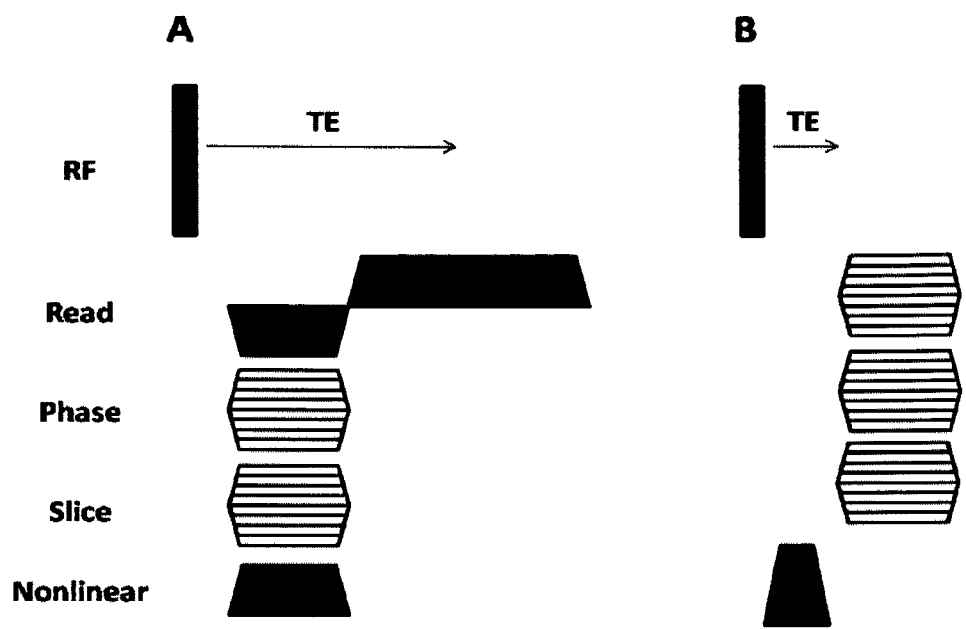
FIGS. 8A-B show nonselective excitation methods used to implement nonlinear phase preparation and spatial encoding.

FIGS. 8A-B show two examples of multidimensional localization strategies using only a nonselective excitation followed by a nonlinear gradient pulse. In FIG. 8A, a nonselective excitation is followed by a standard Cartesian echo acquisition.

FIG. 8B presents a technique using a radial, ultra short echo sequence, where the minimum echo time is determined only by the duration of the nonlinear magnetic field pulse, thus further reducing echo times.

Phase Preparation with RF Excitation

An alternative to preparation using external magnetic fields is to generate the phase preparation function using tailored radiofrequency excitation followed by standard spatial encoding. The phase preparation can be generated by frequency swept RF pulses with or without modulated amplitudes, transmitted through one or multiple channels, possibly together with gradient pulses.

Method Implementation

Feasibility of the invention was tested on a 3 T clinical MRI device (Siemens Medical Solutions, Erlangen, Germany, Trio Model) equipped with a birdcage transmit and 8-channel receive array and two custom pulsed magnetic field inserts. A gradient echo pulse sequence was programmed in the software development environment IDEA. Phase preparation was applied by pulsed magnetic fields between slice-selective excitation and readout.

Phantom Reduced Field of View Imaging

Figure 9:
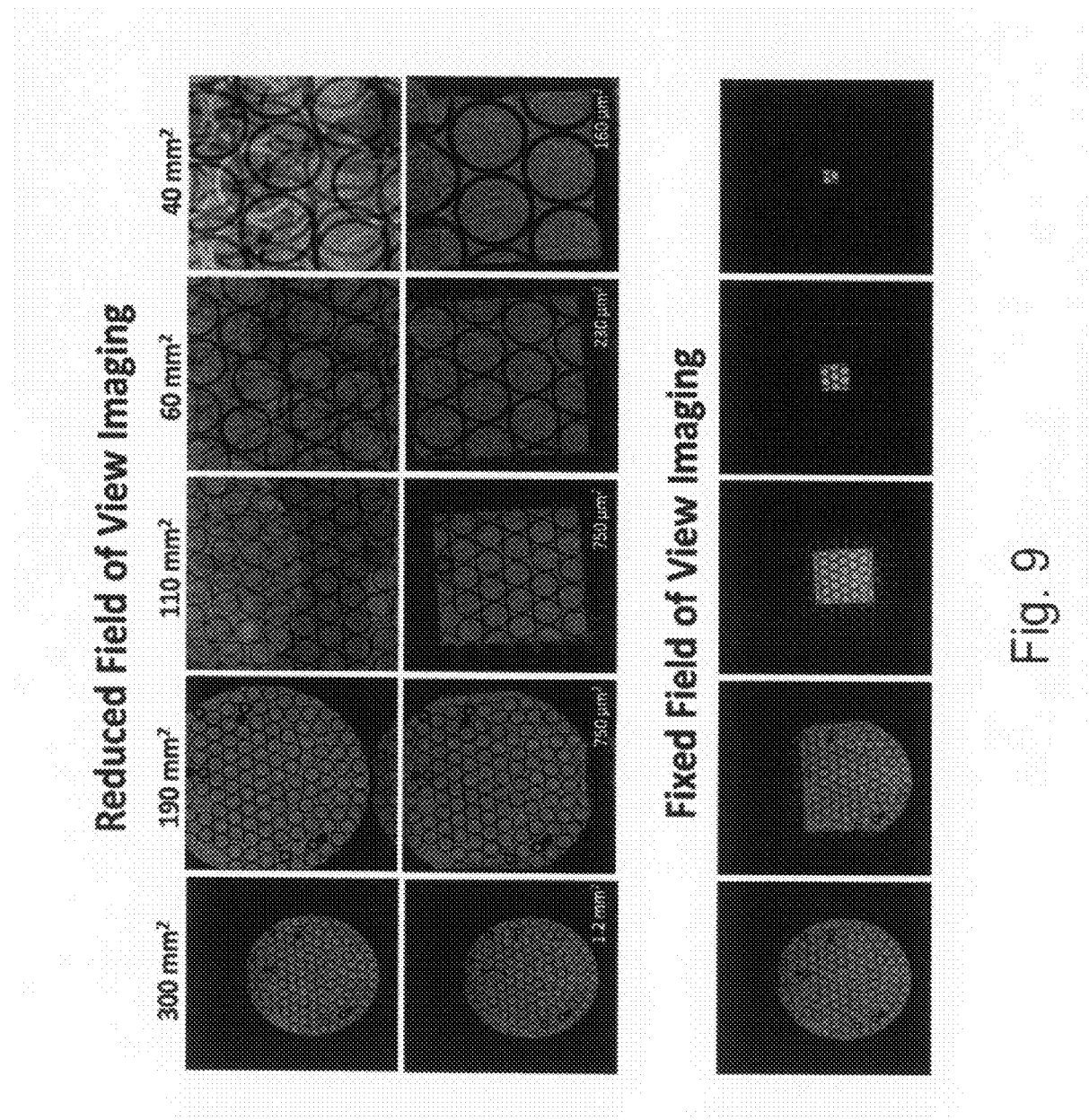
FIG. 9 shows a diagram depicting the effect of reduced field of views with and without nonlinear magnetic fields used to suppress undesirable signals. Here the effect of Cartesian encoding is to alias the undesirable signal into the field of view.

FIG. 9 demonstrates the use of the phase preparation module to acquire reduced field of view images. These images were encoded such that the spatial resolution and matrix size would cause significant aliasing in the absence of the phase preparation pulses (FIG. 9, first row). In FIG. 9, second row, a sufficient phase preparation was applied to suppress the signal from regions outside the desired encoded region. As can be seen form FIG. 9, third row, small areas of localized signal could be obtained with the same resolution, without modification to the encoding functions.

Figure 10:
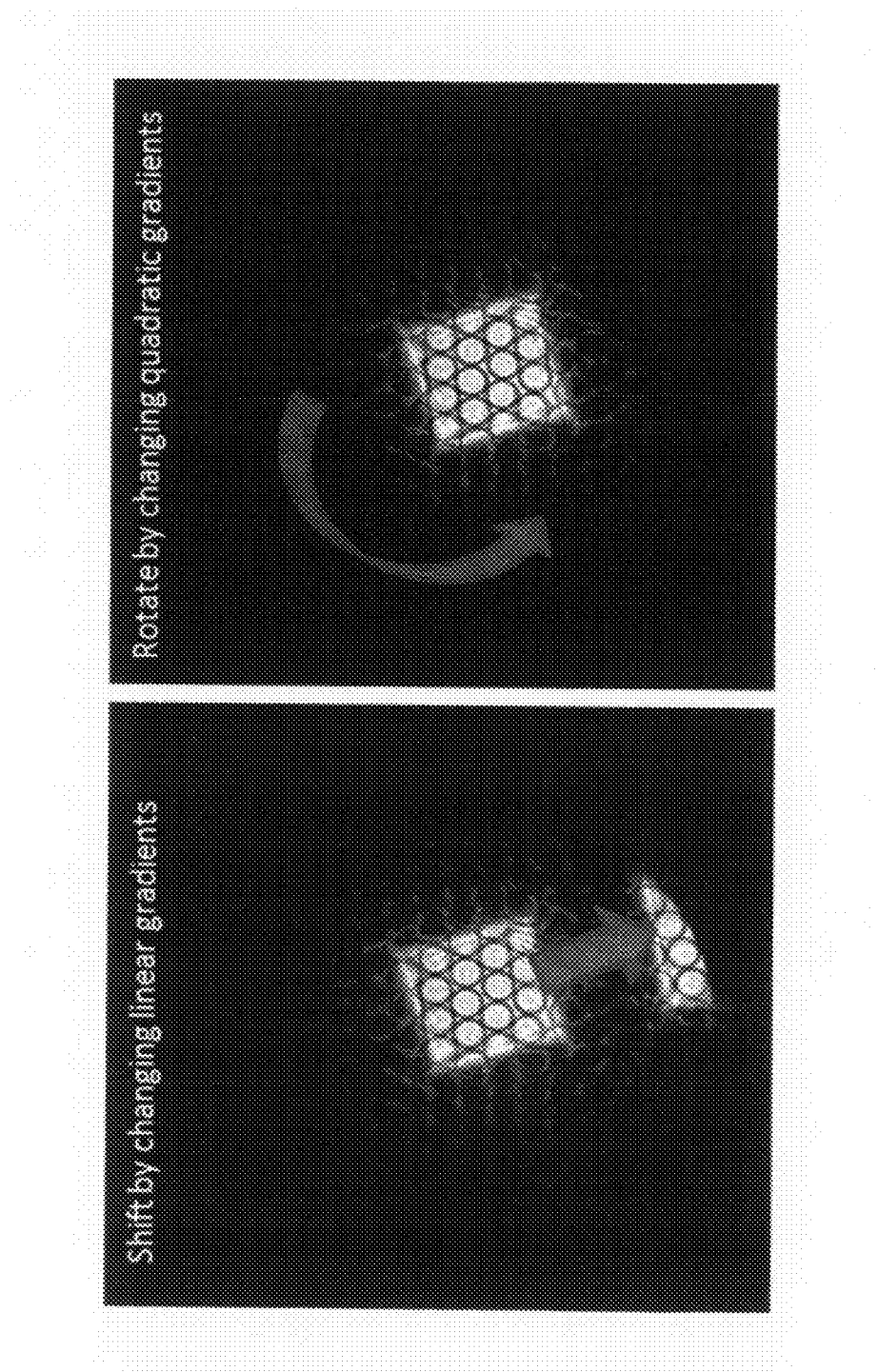
FIG. 10 shows a diagram depicting the effect of changing the amplitude or duration of the localization gradients, resulting in a translation or rotation of the localized imaging volume.

The ability to shift or rotate the desired region is illustrated in FIG. 10. In the phase preparation module, additional linear gradients were pulsed along the x and y axis to generate a shift as described in the section 'Isolating MRI Signals by Phase Preparation and Spatial Encoding'. The direction and size of the shift is determined by spatial encoding, other phase preparations, and, for the case of pulsed magnetic fields, their magnetic field moments. Rotation can be accomplished by an alternative phase preparation scheme. In this case, transformation of the applied pulsed magnetic field moments to a rotated coordinate system determines the shape and rotation of the field.

In Vivo Reduced Field of View Imaging

Figure 11:
FIG. 11 shows a diagram depicting in vivo acquisition of MR-signals using a modified gradient echo sequence used to select a volume of interest from within the object of investigation.

FIG. 11 shows human brain images obtained using a modified gradient echo sequence as described in context with example A in FIG. 7.

The field of view is reduced without aliasing because of the local spatial frequencies outside the object are not sampled during the spatial encoding process. This allows the user to reduce the field-of-view without Fourier aliasing of the signal. The image resolution can be increased significantly within the object of investigation with no change in the total scan time of the acquisition.

Phantom Multidimensional Localization and Local Signal Modulation

Images depicting multidimensional localization obtained using a modified fast spin echo sequence (c.f. FIG. 7, example B) in FIG. 12. Filtering is performed by removing spatial frequency signals from the final acquisition by filtering or by avoiding acquisition of those spatial frequencies during spatial encoding. In this example, a Fourier selection filter taking the form of Shepp-Logan phantom is used to localize signals from the object of investigation. Furthermore, each spatial location can be weighted by the filter itself or by acquiring the same signal multiple times during spatial encoding.

The invention relates to a method of MR with spatial encoding to generate an image or spectroscopic data of an object of investigation inside an MR apparatus comprising the steps of:

(a) selecting a volume of interest within the object of investigation;

(b) applying an RF pulse to generate a transverse magnetization within the object of investigation;

(c) preparing a nonlinear phase distribution within the object of investigation by application of spatially encoding magnetic fields (SEMs), the SEMs comprising of a nonlinear gradient field or a combination of linear and nonlinear gradient fields;

(d) effecting primary spatial encoding through application of SEMs; and (e) recording MR signals originating from the object of investigation.

According to the invention step (c) or (d) comprises applying a sequence of at least two SEMs, at least one of which contains a nonlinear field gradient and at least two of which having different field geometries. The sequence of SEMs is applied at a point in time from and including the excitation of the object of interest in step (b) up to and including the recording of the MR signals in step (e), to thereby introduce a temporal shift of the signals arising from spatially different locations within the selected volume of interest, that is to thereby introduce a shift of local spatial frequency components. A sampling window for recording of the respective MR signals is set and signals originating from the volume of interest are recorded in step (e) and undesired signals originating from outside the volume of interest are suppressed.

REFERENCES

1. Fukushima E, Roeder S B, Assink R A, Gibson V, Atholl A. Nuclear magnetic resonance apparatus having semitoroidal rf coil for use in topical NMR and NMR imaging. USPO 4590427.
2. Hanley, P E. Topical nuclear magnetic resonance spectrometer and method. USPO 4385277.
3. Zenuemon A. Method of obtaining internal information of a measuring target from the outside by the application of a nuclear magnetic resonance phenomenon. USPO 3932805. (1973).
4. Moore W S, Hinshaw W S. Analysis of Materials USPO 4015196 (1975).
5. Hennig J, Boesh C H, Gruetter R, Martin E. Homogeneity spoil spectroscopy as a tool of spectrum localization for in vivo spectroscopy. J Magn Reson. 75 (1987). 179-183.
6. Gordon R E, Hanley P E, Shaw D, Gadian D G, Radda G K, Styles P, Bore P J, Chan L. Localization of metabolites in animals using 31P topical magnetic resonance. Nature. 287 (1980).
7. Chen W, Ackerman J H. Spatially-localized NMR spectroscopy employing an inhomogeneous surface-spoiling magnetic field gradient. 1. Phase coherence spoiling theory and gradient coil design. NMR Biomed. 3; 4 (1990).

8. Chen W, Ackerman J H. Spatially-localized NMR spectroscopy employing an inhomogeneous surface-spoiling magnetic field gradient. 2. Surface coil experiments with multicompartment phantom and rat in vivo. NMR Biomed. 3; 4 (1990).
9. Chen W, Ackerman J H. Surface coil single-pulse localization in vivo via a homogeneous surface spoiling magnetic gradient. NMR Biomed. 1; 4 (1989).
10. Wiesler D G, Wen H, Wolff S D, Balaban R S. Reduction of field of view in MRI using a surface-spoiling local gradient insert. J Magn Reson Imag. 8; 4 (1998).
11. Wiesler D G, Wen H, Wolff S D, Balaban R S. Improved field of view-reducing gradient insert: artifacts and application to cardiac imaging. J Magn Reson Imag 10 (1999).
12. Geoffrion Y, Rydzy M, Butler K W, Smith I C P, Jarrell H C. The use of immobilized ferrite to enhance the depth selectivity of in vivo surface coil NMR spectroscopy. NMR Biomed. 1; 3 (1988).
13. Post H, Ratzel D, Brunner P. Method for measuring the nuclear magnetic resonance. USPO 4558277. (1985).
14. Satoshi Ito S, Yamada Y. Alias-free image reconstruction using Fresnel transform in the phase-scrambling Fourier imaging technique. Magn Reson Med 60:422-30 (2008).
15. Pipe J G. Spatial encoding and reconstruction in MRI with quadratic phase profiles. Magn Reson Med 33:24-33 (1995).
16. Maudsley A A. Dynamic range improvement in NMR imaging using phase scrambling. J Magn Reson 76:287-305 (1988).
17. Wedeen V J, Chao Y S, Ackerman J L. Dynamic range compression in MRI by means of a nonlinear gradient pulse. Magn Reson Med 6(3):287-95 (1988).
18. Griswold M A, Jakob P M, Heidemann R M, Nittka M, Jellus V, Wang J, Kiefer B, Haase A. Generalized autocalibrating partially parallel acquisitions (GRAPPA). Magn Reson Med 47(6):1202-10 (2002).
19. Zaitsev M, Shultz G, Hennig J. Extended anti-aliasing reconstruction for phase-scrambled MRI with quadratic phase modulation. In: Proceedings of ISMRM, Honolulu, p. 2859 (2009).
20. Zaitsev M, Hennig J. Reference-free parallel imaging with phase scrambling. In: Proceedings of ISMRM, Honolulu. p. 2675 (2009).

The invention claimed is:

1. A method of magnetic resonance (=MR) with spatial encoding to generate an image or spectroscopic data of an object of investigation inside an MR apparatus, the method comprising the steps of:
   (a) selecting a volume of interest within the object of investigation;
   (b) applying an RF pulse to generate a transverse magnetization within the object of investigation;
   (c) preparing a nonlinear phase distribution of the transverse magnetization within the object of investigation by application of spatially encoding magnetic fields (SEMs), the SEMs comprising a nonlinear gradient field or a combination of linear and nonlinear gradient fields, wherein an object location-spatial frequency correspondence is thereby generated;
   (d) effecting primary spatial encoding through application of SEMs to acquire particular spatial frequencies predetermined by the encoding process and the k-space trajectory, thereby constraining sampled Fourier components, wherein sampling is carried out for a fixed period of time and spatial frequencies greater than a maximum encoded spatial frequency are thereby not recovered, wherein preparation of the nonlinear phase distribution in step (c) and primary spatial encoding in step (d) comprise applying a sequence of at least two SEMs, at least one of which contains a nonlinear field gradient and at least two of which have different field geometries, wherein the sequence of the at least two SEMs is applied at a point in time from and including excitation of the object of investigation in step (b) up to and including a recording of MR signals, thereby introducing a temporal shift of signals arising from spatially different locations within the selected volume of interest and thereby introducing a shift of local spatial frequency components, wherein a sampling window for recording of the respective MR signals is set, such that signals originating from the volume of interest are recorded and undesired signals originating from outside the volume of interest are suppressed; and
   (e) recording MR signals originating from the object of investigation.

2. The method of claim 1, wherein the nonlinear gradient field used in step (c) is a quadratic magnetic field resulting in a linear correspondence between locations within the object of investigation and respective local spatial frequencies in a spatial frequency domain.

3. The method of claim 1, wherein preparing the nonlinear phase distribution in step (c) or effecting a primary spatial encoding in step (d) are performed in either two or three dimensions.

4. The method of claim 2, wherein magnetic fields used in step (c) or (d) are spatially variable and constant or variable in time, the magnetic fields being simultaneously applied during transmission of a radiofrequency (RF) pulse.

5. The method of claim 1, wherein the nonlinear field is produced by a shim coil of first, second or higher order.

6. The method of claim 1, wherein a technique is used to reduce spatial frequency aliasing artifacts from locations within the object of investigation, the technique involving a multi-coil reconstruction technique, SENSE, GRAPPA or an analogous technique to eliminate aliasing artifacts from inconsistent or misplaced encoded signals by virtue of coil sensitivities.

7. The method of claim 1, wherein conventional imaging sequences, gradient echo, spin echo, fast low angle shot (FLASH), fast spin echo (FSE), echo planar imaging (EPI), nuclear magnetic resonance spectroscopy techniques or chemical shift imaging (CSI) are used for generating the image or spectroscopic data.

8. The method of claim 7, wherein Cartesian, radial or spiral encoding strategies are used for filling of a spatial frequency domain.

9. The method of claim 7, wherein acceleration techniques are used, the acceleration techniques making use of spatial frequency domain, k-space (GRAPPA) or image space (SENSE) reconstructions.

10. The method of claim 1, wherein desired spatial frequencies are acquired multiple times to enhance signals in a spatially dependent way.

11. The method of claim 1, wherein MR-echoes are reordered in single- or multi-shot acquisitions.

12. The method of claim 1, wherein undesired spatial frequency components are suppressed by a further post-processing.

13. The method of claim 1, further comprising post-processing disregarding undesired spatial frequency components.

14. Use of the method of claim 1 for imaging a human body with reduced image acquisition time at a given resolution by eliminating signals from outside a specified volume of interest.

15. A magnetic resonance (=MR) device, the device having spatial encoding to generate an image or spectroscopic data of an object of investigation inside an MR apparatus, the device comprising:
- means for selecting a volume of interest within the object of investigation;
- means for applying an RF pulse to generate a transverse magnetization within the object of investigation;
- means for preparing a nonlinear phase distribution of the transverse magnetization within the object of investigation by application of spatially encoding magnetic fields (SEMs), the SEMs comprising a nonlinear gradient field or a combination of linear and nonlinear gradient fields, wherein an object location-spatial frequency correspondence is thereby generated;
- means for effecting primary spatial encoding through application of SEMs to acquire particular spatial frequencies predetermined by the encoding process and the k-space trajectory, thereby constraining sampled Fourier components, wherein sampling is carried out for a fixed period of time and spatial frequencies greater than a maximum encoded spatial frequency are thereby not recovered, wherein the means for preparing the nonlinear phase distribution and the means for effecting primary spatial encoding comprise means for applying a sequence of at least two SEMs, at least one of which contains a nonlinear field gradient and at least two of which have different field geometries, wherein the sequence of the at least two SEMs is applied at a point in time from and including excitation of the object of investigation up to and including a recording of MR signals, thereby introducing a temporal shift of signals arising from spatially different locations within the selected volume of interest and thereby introducing a shift of local spatial frequency components, wherein a sampling window for recording of the respective MR signals is set, such that signals originating from the volume of interest are recorded and undesired signals originating from outside the volume of interest are suppressed; and
- means for recording MR signals originating from the object of investigation.

* * * * *